(12) United States Patent
Colgan et al.

(10) Patent No.: US 7,768,121 B2
(45) Date of Patent: Aug. 3, 2010

(54) APPARATUS AND METHODS FOR COOLING SEMICONDUCTOR INTEGRATED CIRCUIT PACKAGE STRUCTURES

(75) Inventors: Evan George Colgan, Chestnut Ridge, NY (US); Jeffrey D. Gelorme, Burlington, CT (US); Kamal K. Sikka, Poughkeepsie, NY (US); Hilton T. Toy, Hopewell Junction, NY (US); Jeffrey Allen Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 11/927,145

(22) Filed: Oct. 29, 2007

(65) Prior Publication Data

US 2008/0042264 A1 Feb. 21, 2008

Related U.S. Application Data

(62) Division of application No. 10/789,500, filed on Feb. 27, 2004, now Pat. No. 7,288,839.

(51) Int. Cl.
*H01L 23/495* (2006.01)
*H01L 23/10* (2006.01)
*H01L 21/00* (2006.01)

(52) U.S. Cl. .............. 257/707; 257/675; 257/706; 438/122

(58) Field of Classification Search .......... 257/675, 257/706, 707
See application file for complete search history.

(56) References Cited

U.S. PATENT DOCUMENTS

| | | | | |
|---|---|---|---|---|
| 4,069,498 | A * | 1/1978 | Joshi | 257/713 |
| 4,235,283 | A * | 11/1980 | Gupta | 165/80.4 |
| 4,639,829 | A * | 1/1987 | Ostergren et al. | 361/718 |
| 5,052,481 | A * | 10/1991 | Horvath et al. | 165/185 |
| 5,456,081 | A * | 10/1995 | Chrysler et al. | 62/3.7 |
| 2003/0131476 | A1* | 7/2003 | Ocher et al. | 29/890.03 |
| 2004/0011507 | A1* | 1/2004 | Mok | 165/80.3 |
| 2004/0020634 | A1* | 2/2004 | Boudreaux et al. | 165/104.33 |
| 2004/0105234 | A1* | 6/2004 | Messina et al. | 361/699 |
| 2004/0150952 | A1* | 8/2004 | Yu et al. | 361/697 |
| 2005/0134507 | A1* | 6/2005 | Dishongh et al. | 343/700 MS |

* cited by examiner

*Primary Examiner*—Matthew C Landau
*Assistant Examiner*—James M Mitchell

(57) ABSTRACT

Apparatus and methods are provided for thermally coupling a semiconductor chip directly to a heat conducting device (e.g., a copper heat sink) using a thermal joint that provides increased thermal conductivity between the heat conducting device and high power density regions of the semiconductor chip, while minimizing or eliminating mechanical stress due to the relative displacement due to the difference in thermal expansion between the semiconductor chip and the heat conducting device.

14 Claims, 11 Drawing Sheets

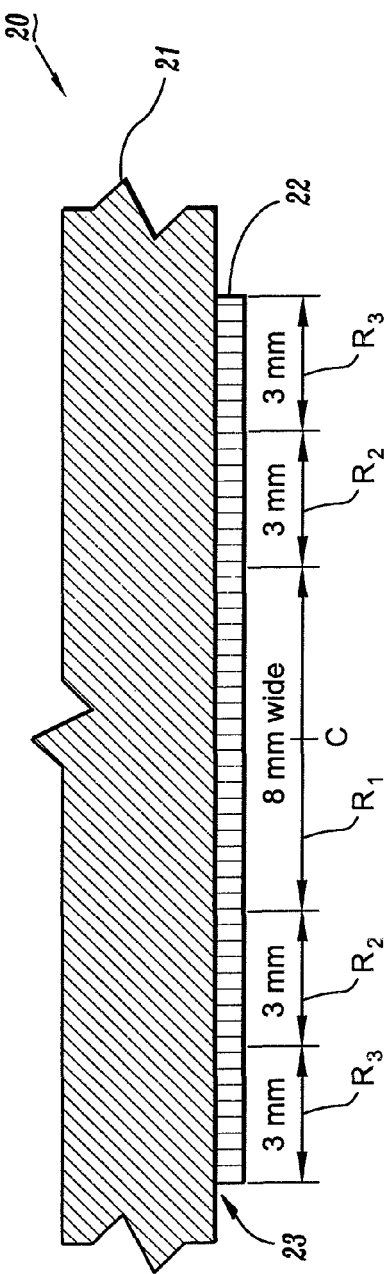
FIG. 2A
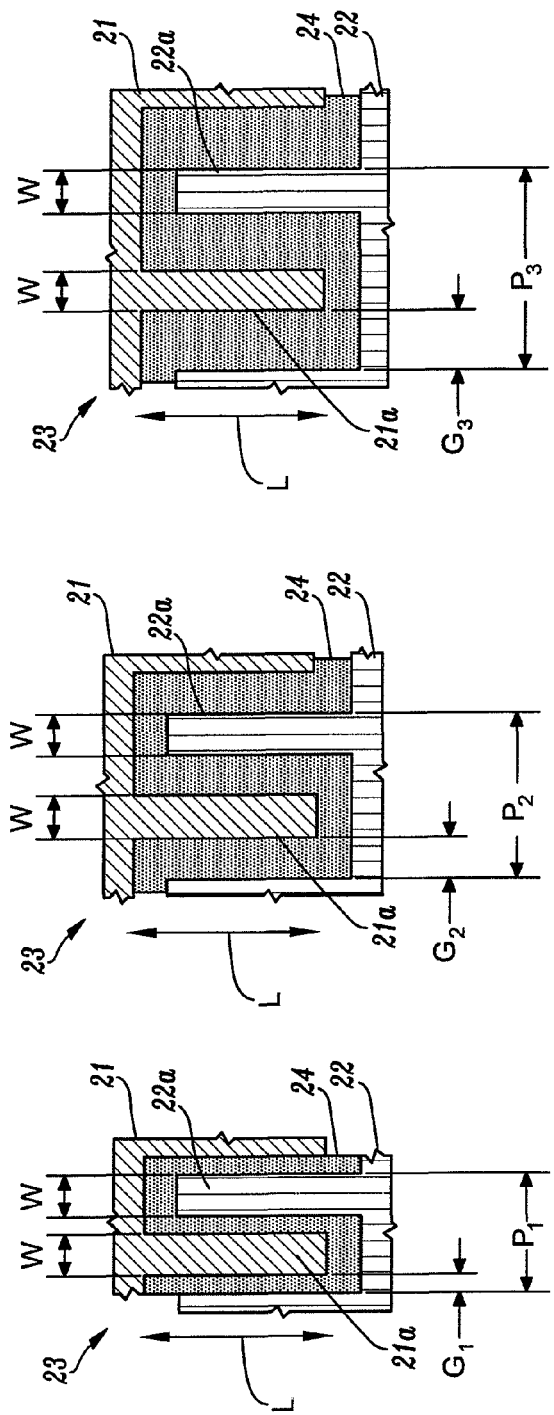
FIG. 2B   FIG. 2C   FIG. 2D

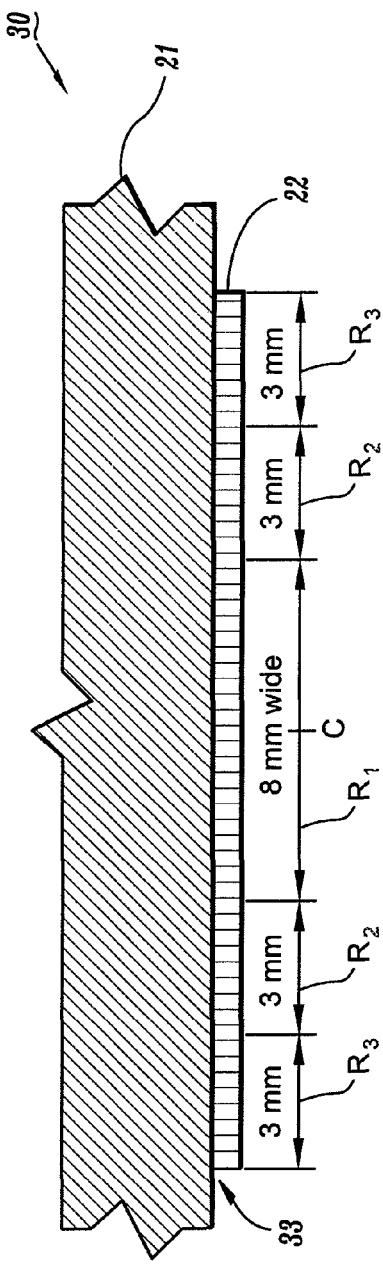
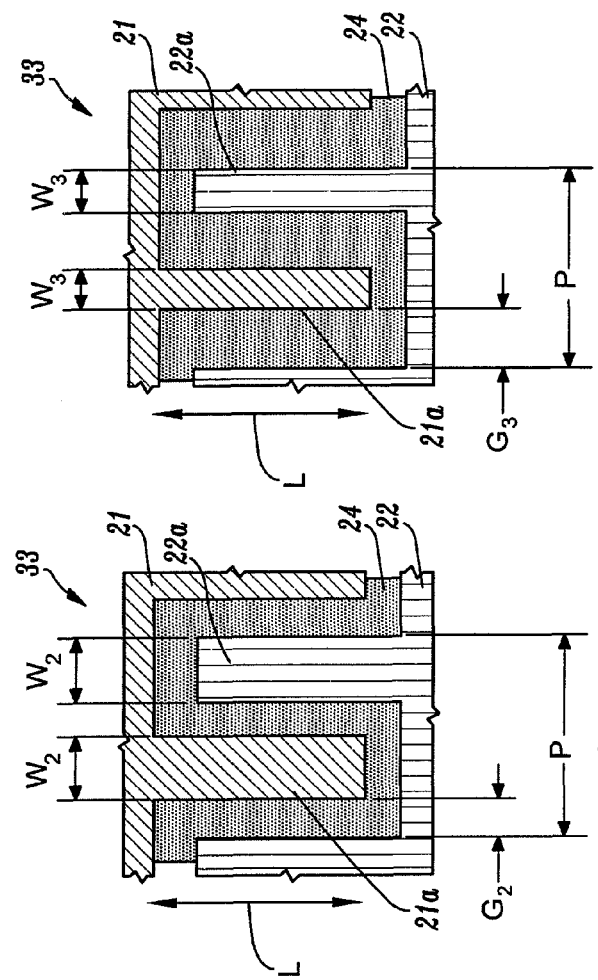
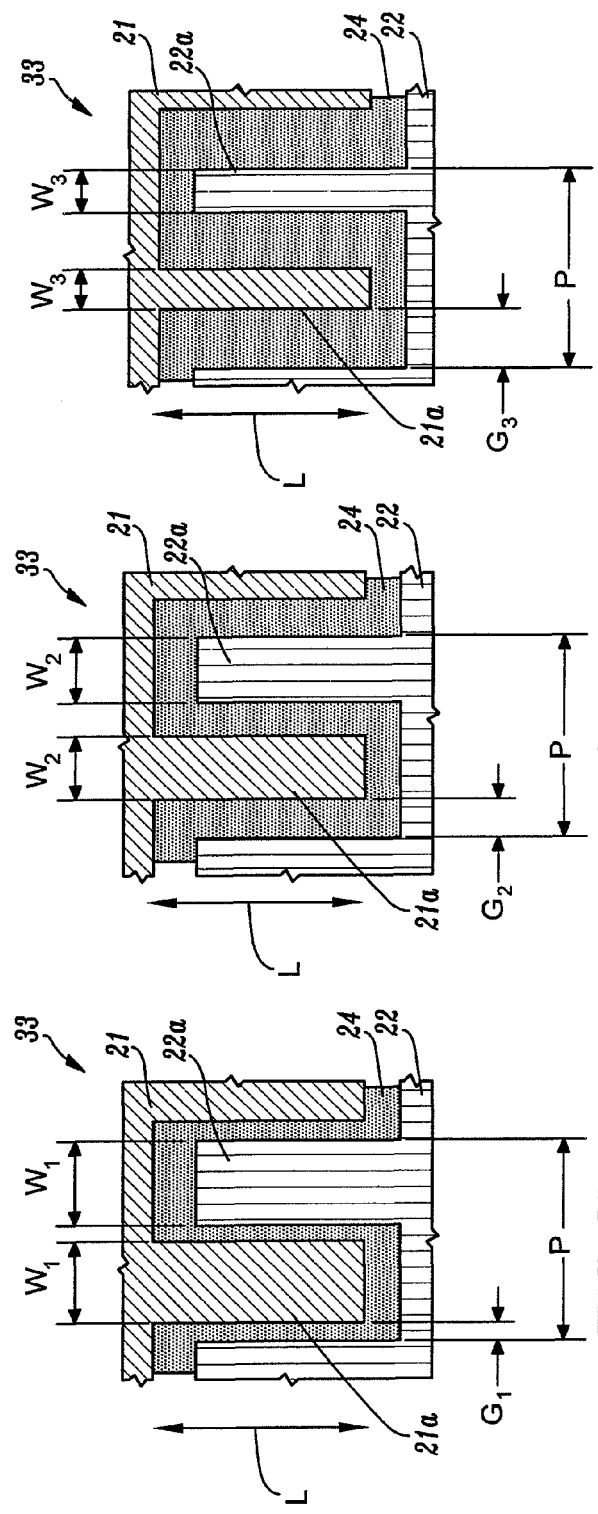
FIG. 3A
FIG. 3B
FIG. 3C
FIG. 3D

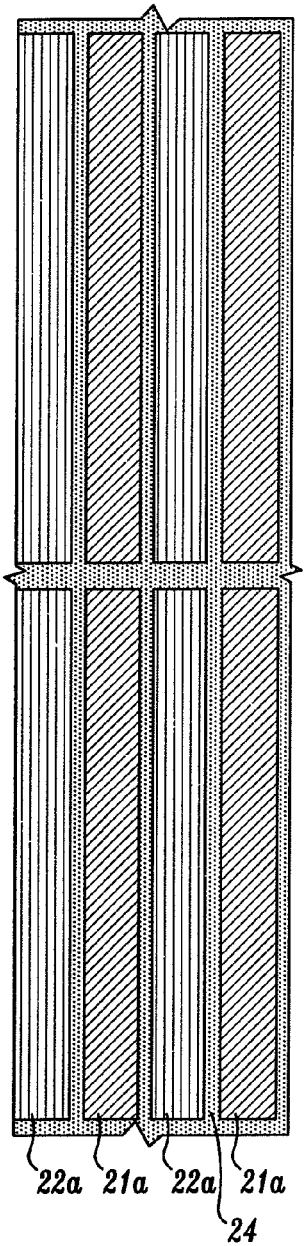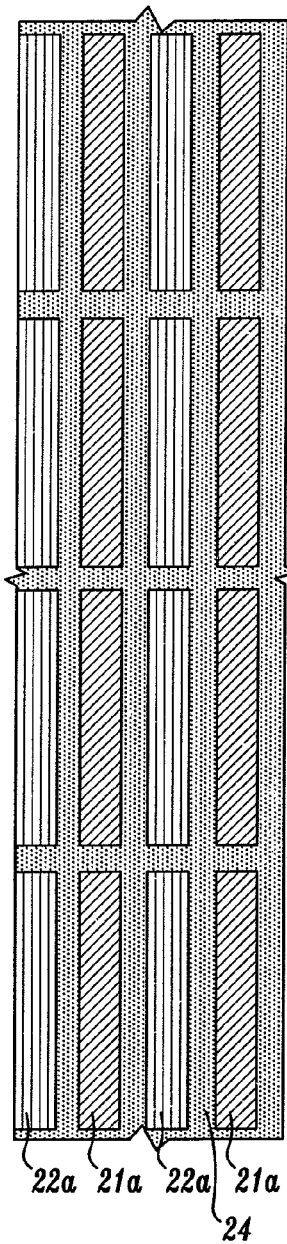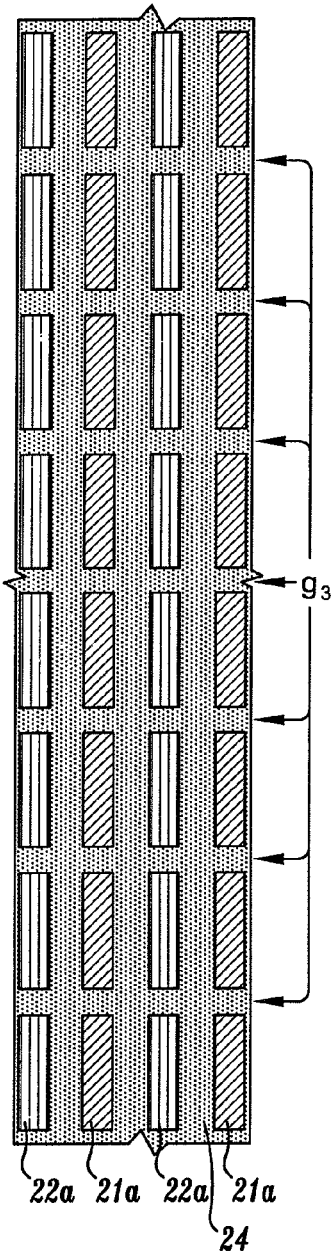
FIG. 3E  FIG. 3F  FIG. 3G

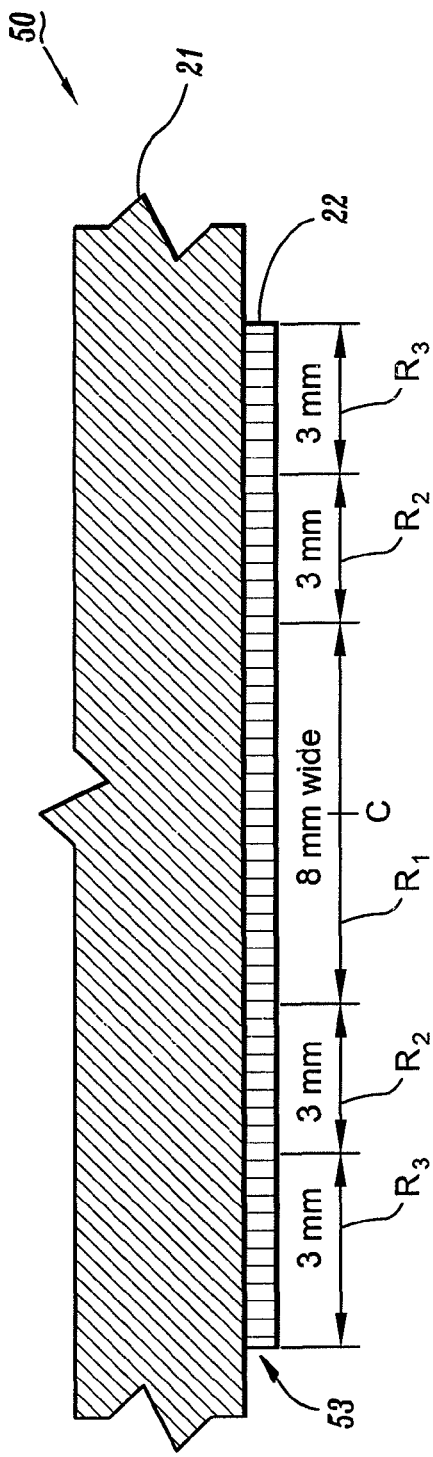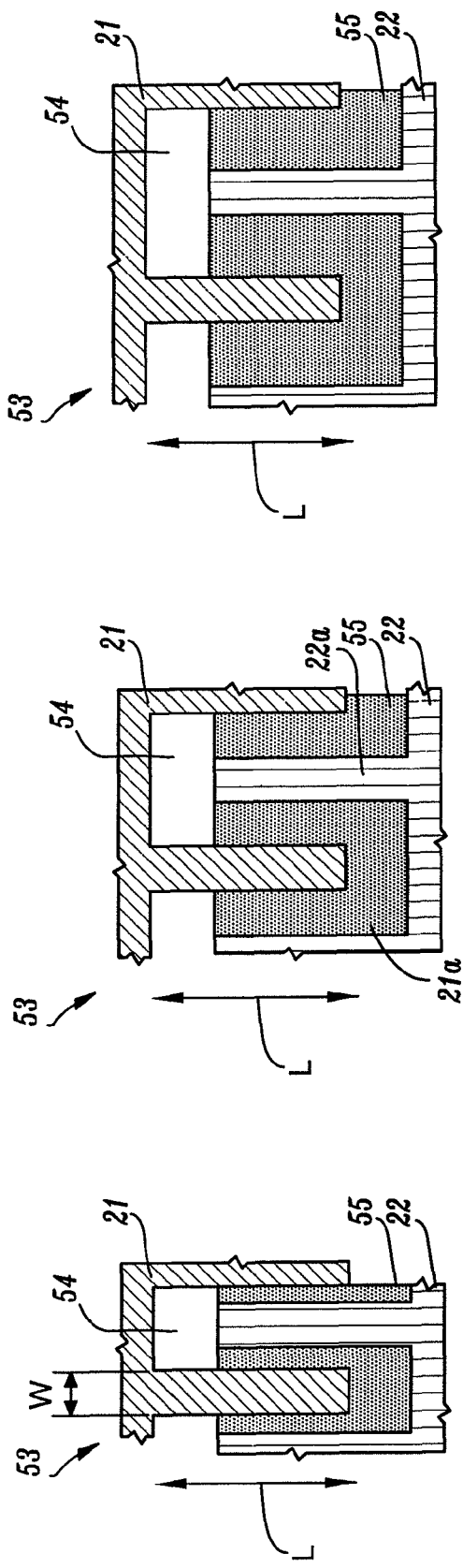

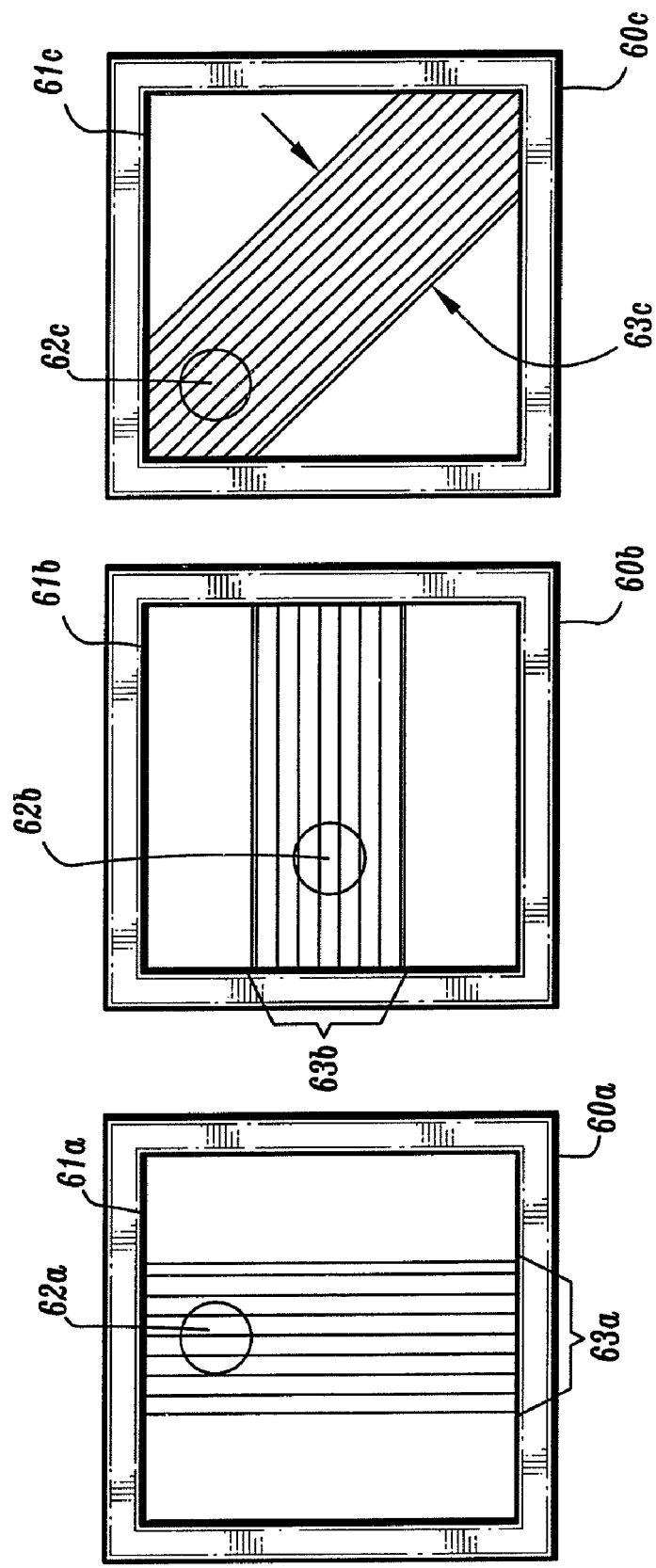

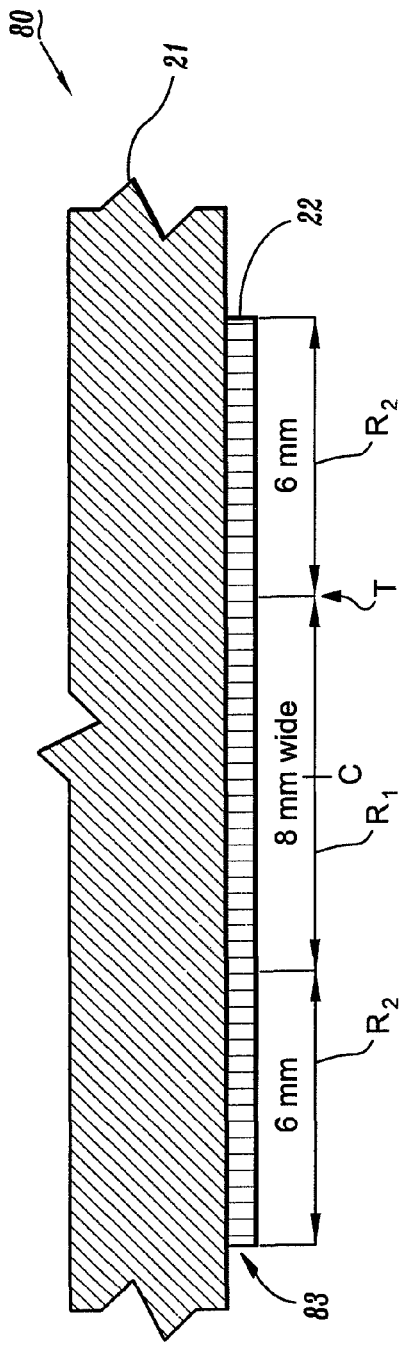
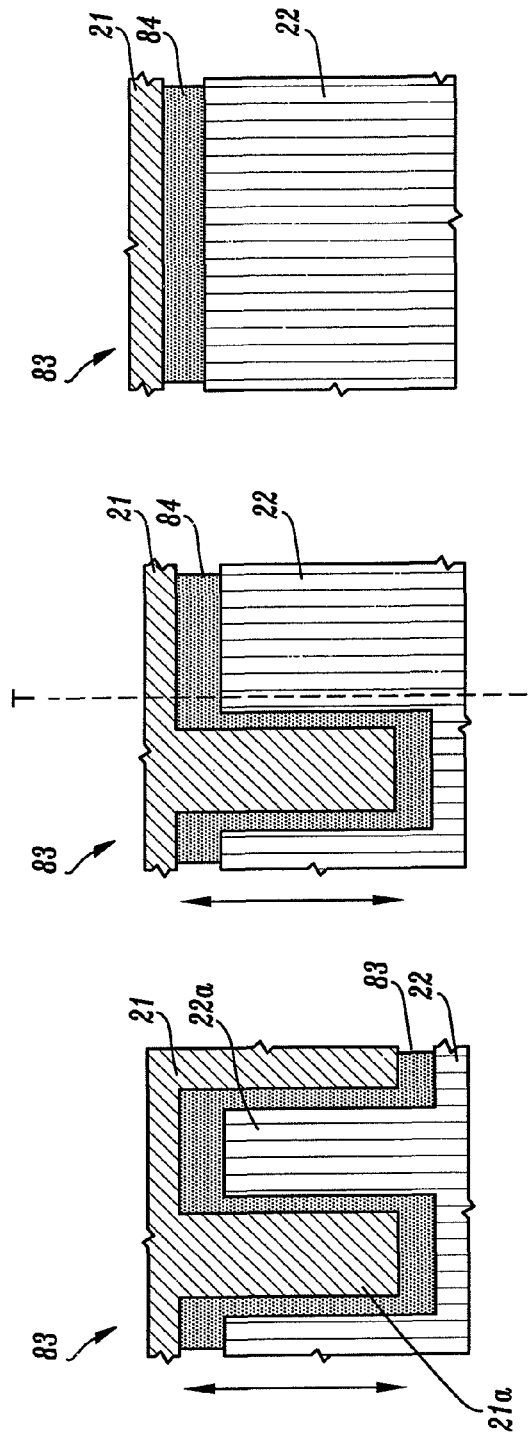
FIG. 8A
FIG. 8B
FIG. 8C
FIG. 8D

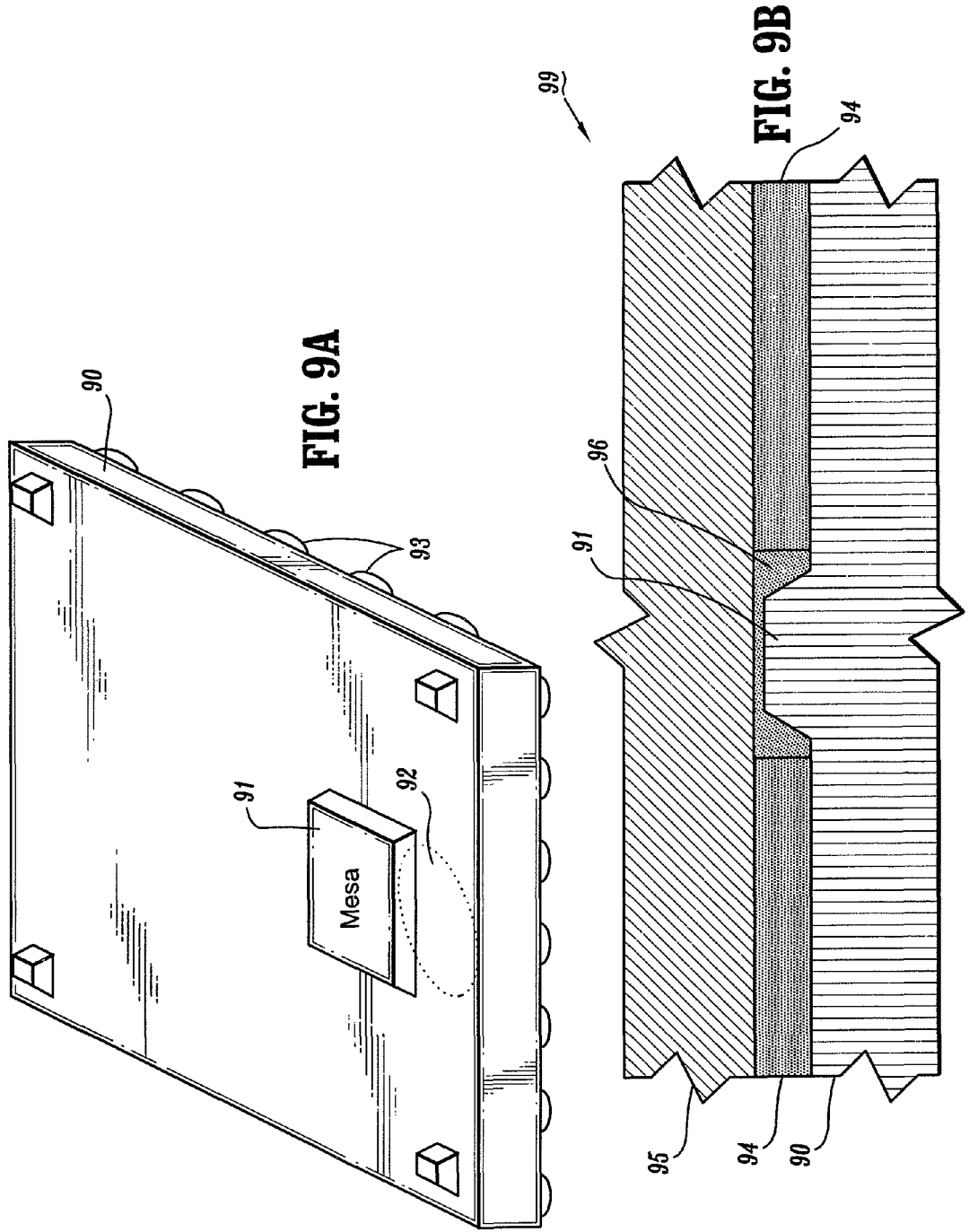

APPARATUS AND METHODS FOR COOLING SEMICONDUCTOR INTEGRATED CIRCUIT PACKAGE STRUCTURES

CROSS-REFERENCE TO RELATED APPLICATION

This is a Divisional Application of U.S. application Ser. No. 10/789,500 filed on Feb. 27, 2004, now U.S. Pat. No. 7,288,839 the disclosure of which is herein incorporated by reference in its entirety.

TECHNICAL FIELD OF THE INVENTION

The present invention relates generally to apparatus and methods for cooling semiconductor integrated circuit (IC) chip packages. More specifically, the present invention relates to apparatus and methods for thermally coupling a semiconductor chip directly to a heat conducting device (e.g., a copper heat sink) using a thermal joint that provides increased thermal conductivity between the heat conducting device and high power density regions of the semiconductor chip, while minimizing or eliminating mechanical stress from the relative displacement with temperature cycling due to the differences in thermal expansion between the semiconductor chip and the heat conducting device.

BACKGROUND

In the design and manufacture of semiconductor IC (integrated circuit) chip packages and modules, it is imperative to consider and implement mechanisms that can effectively remove heat that is generated during operation of the IC chip devices (e.g., transistors). Indeed, the operating temperatures of chip devices must be maintained low enough to ensure continued reliable operation of such devices. The ability to efficiently remove heat becomes even more problematic as chip geometries are scaled down and operating speeds are increased, resulting in increased power density. As such, the ability to effectively cool semiconductor chips is a factor that limits increases in system performance.

There are various techniques that have been developed for removing heat from semiconductor packages. For example, one technique that is typically employed includes thermally coupling a heat sink or cooling plate to one or more semiconductor IC chips using a compliant thermally conductive material. The cooling plate or heat sink, which is typically formed of a high thermal conductivity material, such as copper or aluminum, will conduct heat away from the IC chip(s) and the heat is removed from the cooling plate or heat sink by methods such as forced air cooling or circulating liquid coolants.

A compliant thermally conductive material is used to thermally couple the IC chip and cooling plate (as opposed to a rigid bond) when, for example, the difference in thermal expansion between the material of the IC chip and the material of the cooling plate or heat sink is relatively large. A cooling plate, or high performance heat sink, or package lid, is typically made of copper (Cu), which has thermal coefficient of expansion (TCE) of about 16.5 ppm/° C., which is substantially larger than the TCE of Silicon (Si) which is about 2.5 ppm/° C. The layer of compliant thermally conductive material reduces stress at the thermal connection due to differences in thermal expansion of the IC chip and heat sink.

Compliant thermally conductive materials include, for example, thermal pastes, thermal greases, or thermally conductive fluids such as oils, and are frequently referred to as thermal interface materials, or TIMs. Thermally conductive pastes typically comprise thermally conductive particles having a distribution of sizes dispersed within a binder material or matrix (such as the paste described in U.S. Pat. No. 5,098,609). A thermally conductive paste can be applied between the top of an IC chip that is mounted on a substrate and a lower flat surface of a cooling plate facing the substrate. Typical TIMs include those having a wax matrix, commonly known as phase-change materials, those having a silicone-based matrix, and dry particle lubricants such as graphite and metal powders. Less viscous thermally conductive materials, such as oils, have a lower thermal conductivity than pastes, but can also be applied in much thinner layers, resulting in improved thermal performance, but less mechanical compliance.

Other conventional techniques for attaching a heat sink to a semiconductor chip package include bonding a heat spreader directly to a non-active surface of an IC chip using a thermally conductive rigid bonding material and then thermally coupling a heat sink to the heat spreader using a compliant thermally conductive material.

Indeed, when the thermal expansion match of the materials that form the heat spreader and IC chip are closely matched, a rigid bond may be used to thermally couple the heat spreader to the IC chip. More specifically, by way of example, in a single chip module (SCM) type package comprising a silicon IC chip, a thermal spreader composed of a high thermal conductivity material with a thermal expansion coefficient close to that of Si, such as SiC (TCE of ~4 ppm/° C.) or diamond (TCE of ~2.8 ppm/° C.), can be rigidly bonded to the IC chip using a silver filled epoxy, filled polymer adhesive, filled thermoplastic or solder, or other thermally conductive bonding material. Polymer materials for thermally conductive bonds may be filled with particles of any material with a high thermal conductivity. A rigid bond typically has a lower thermal resistance than a layer of compliant thermally conductive material. The ability to effectively use a rigid bond is limited not only by the difference in the TCEs of the materials that form the heat spreader and IC chip, but also on the temperature range (cycle) in which the semiconductor package will operate or be exposed to, as well as size of the area over which the rigid bond will be formed.

A heat sink can then be mounted onto the thermal spreader using a layer of a compliant thermally conductive material. In some packages, the package cap, or lid, acts as a thermal spreader and a heat sink is subsequently attached to the top surface of the package cap or lid.

Moreover, effective heat removal is difficult for densely packed, high-powered devices. For example, a multi-chip module (MCM) package which comprises an array of IC chips mounted face down on a common substrate, presents special cooling difficulties. In an MCM package, the IC chips may be mounted very close together and nearly cover the entire top surface of the MCM. With such an arrangement, it may not be possible to use a heat spreader bonded directly to the back surface of the chips, as is sometimes used for isolated chips, to reduce the heat flux (power/unit area, i.e. W/cm$^2$).

Furthermore, difficulties arise for efficient heat removal with respect to IC chips, such as processors, that have "hot spot" regions, which can have a heat flux significantly greater than the average heat flux, resulting in temperatures ~20° C. hotter than the average chip temperature. A thermal solution that may be adequate for efficiently removing heat that is generated due to average chip power density may not be adequate for removing heat at "hot spot" regions of the chip, which can result in failure of the chip devices in or near the "hot spot" region.

FIG. 1 is a diagram that schematically illustrates a conventional apparatus for thermally coupling a semiconductor chip to a heat sink using techniques such as disclosed in U.S. Pat. No. 5,838,065. The apparatus (10) includes a IC chip (11) having a plurality of fins (12) formed on a non-active surface of the chip (11). In addition, the apparatus comprises another substrate (13) having a plurality of fins (14) formed on one surface of the substrate (13) and a heat sink (15) is thermally coupled (16) to another surface of the substrate (13). The material of the substrate (13) is selected to have a TCE that closely matches the TCE of the material of the IC chip (11). A thermal connection is formed by interleaving the fins (12) and (14) of the substrates (11) and (13) and bonding the two substrates together, with a silicon dioxide or fusion bond, for example.

In general, the conventional methods described above do not provide means for forming a low thermal resistance interface directly between an IC chip and a heat sink formed of a highly thermally conductive material such as copper, where the heat is dissipated to the ambient. For example, although a thermal connection can be formed by applying a compliant thermally conductive material between a back surface of a chip and surface of cooling plate or heat sink or lid made of copper or aluminum, for example, there are factors that limit the thermal conductivity that can be obtained with such thermal connection.

For instance, the thermal resistance of the paste or fluid layer can be reduced by increasing the thermal conductivity of the material, reducing the thickness of the layer, or increasing the surface area of the thermal joint. However, the thermal conductivity of a paste is limited by the volume fraction which can be occupied by solid particles while still providing adequate mechanical compliance. For an MCM, a typical thermal paste thickness (formed between 2 flat mating surfaces) is about 4 mil as it is necessary to provide adequate mechanical compliance in the structure so that micro solder balls (e.g., C4's) which provide electrical connections from the chip to the substrate are not crushed, and it is necessary to keep the thermal paste from being squeezed out of the thermal joint during cyclic loading (i.e. paste pumping), leading to an increased thermal resistance. Moreover, the thickness of thermally conductive fluids is limited by the roughness of the surfaces being joined and the sizes of the particles, if any, in the fluid, with a typical thickness being about 0.5 mil.

Moreover, although the use of rigidly bonded interleaved fins (12, 14) in the conventional package structure of FIG. 1 can provide a low thermal resistance path from the chip (11) to a TCE matched substrate (13), the thermal joint (16) between the substrate (13) and the heat sink (15) is not improved. Thus, the package (10) in FIG. 1 does not provide means for forming a low thermal resistance interface directly between an IC chip and a heat sink formed of a highly thermally conductive material such as copper.

Moreover, the conventional methods described above do not provide thermal connections that can locally reduce the thermal resistance over chip "hot-spots", to provide increase thermal cooling for chips with non-uniform power densities.

SUMMARY OF THE INVENTION

Exemplary embodiments of the invention generally include apparatus and methods for cooling semiconductor integrated circuit (IC) chip packages. More specifically, exemplary embodiments of the invention include apparatus and methods for thermally coupling a semiconductor chip directly to a heat conducting device, which is formed of a material having a high thermal conductivity (e.g., copper heat sink or package lid). Thermal coupling is achieved using a thermal joint that provides increased thermal conductivity (or reduced thermal resistance) of the thermal connection between the semiconductor chip and the heat conducting device, while minimizing or eliminating mechanical stress at the thermal joint caused by the relative displacement between the semiconductor chip and heat conducting device with temperature cycling due to differences in thermal expansion between the chip and heat conducting device over a wide temperature range. Moreover, exemplary embodiments of the invention include apparatus and methods for thermally coupling a semiconductor chip directly to a heat conducting device using a thermal joint that provides reduced thermal resistance at specific areas of the chip where there are greater than average power densities, to thereby avoid "hot spots".

In one exemplary embodiment of the invention, a semiconductor package includes a semiconductor chip having a plurality of first thermal fins on a non-active surface of the semiconductor chip which longitudinally extend across the non-active surface of the semiconductor, a heat conducting device having a plurality of second thermal fins on a mating surface of the heat conducting device which longitudinally extend across the mating surface of the heat conducting device, and a thermal joint formed between the non-active surface of the semiconductor chip and the mating surface of the heat conducting device, wherein the thermal joint comprises a plurality of interdigitated thermal fins separated by a compliant thermally conductive material, wherein the interdigitated thermal fins comprise the first and second thermal fins, and wherein a gap size between the interdigitated thermal fins of the thermal joint varies across the thermal joint.

In other exemplary embodiments of the invention, the thermal joint comprises a plurality of bands of interdigitated thermal fins, wherein the gap size between the interdigitated thermal fins of the thermal joint is varied across the thermal joint by maintaining a fixed gap size between interdigitated thermal fins in each band, while providing a different fixed gap size between interdigitated thermal fins in different bands. The gap size between interdigitated thermal fins can be varied by maintaining the interdigitated thermal fins in all bands at same fixed width, while providing a different pitch between the first thermal fins and corresponding second thermal fins forming the interdigitated thermal fins in different bands. The gap size between interdigitated thermal fins can be varied by maintaining a fixed pitch between the first thermal fins and between the corresponding second thermal fins forming the interdigitated thermal fins in all the bands, while providing a different width of the interdigitated thermal fins in different bands.

In another exemplary embodiment of the invention, the thermal joint comprises a first band of interdigitated thermal fins that provides a thermal conductivity between the semiconductor chip and heat conducting device which is greater than that thermal conductivity provided by other bands of interdigitated thermal fins. The first band can be orientated to extend in a direction that passes through a neutral stress point of the semiconductor package or the first band of interdigitated thermal fins can be orientated to extend in a direction that passes through a hot spot area of the semiconductor chip as well as the neutral stress point of the semiconductor package.

In accordance with the invention, a TCE (thermal coefficient of expansion) of a material forming the heat conducting device can be three times or greater than a TCE of a material forming the semiconductor chip, without resulting in mechanical stress on the thermal joint due to relative displacement of the chip and heat conducting device over a wide temperature range. For example, the semiconductor chip can be formed of silicon, and the heat conducting device can be formed of copper. In various embodiments of the invention, the heat conducting device can be a package lid, a package cap, a heat sink, a cooling plate, or a thermal hat.

In another exemplary embodiment of the invention, a MCM (multiple chip module) package comprises a package substrate, a plurality of semiconductor chips mounted face down on the substrate, and a heat conducting device that is thermally coupled to a non-active surface of each of the plurality of semiconductor chip using a thermal joint connection between at least one of the semiconductor chips and the heat conducting device. Each thermal joint comprises a plurality of longitudinally extending interdigitated thermal fins separated by a compliant thermally conductive material and the longitudinally extending interdigitated thermal fins of each thermal joint formed between the semiconductor chips and heat conducting device are orientated to extend in a direction that passes through a neutral stress point of the semiconductor package.

In yet another exemplary embodiment of the invention, a semiconductor package comprises a semiconductor chip having a plurality of first thermal fins on a portion of a non-active surface of the semiconductor chip which longitudinally extend across the portion of the non-active surface of the semiconductor chip, a heat conducting device having a plurality of second thermal fins on a portion of a mating surface of the heat conducting device which longitudinally extend across the portion of the mating surface of the heat conducting device, and a thermal joint formed between the non-active surface of the semiconductor chip and the mating surface of the heat conducting device. The thermal joint comprises a band of interdigitated thermal fins comprises the first and second thermal fins mated together and thermally coupled using a rigid bonding material or a compliant thermally conductive material. The thermal joint further comprises a complaint thermal conductive material formed between planar portions of the non-active surface of the semiconductor chip and the mating surface of the heat conducting device.

In another exemplary embodiment of the invention, a semiconductor package comprises a semiconductor chip having a mesa formed on a non-active surface of the semiconductor chip, wherein the mesa coincides with a hot spot region of the semiconductor chip, a heat conducting device having a planar mating surface, and a thermal joint formed between the non-active surface of the semiconductor chip and the planar mating surface of the heat conducting device. The thermal joint comprises a rigid bonding material formed between the mesa on the non-active surface of the semiconductor chip and the planar surface of the heat conducting device. The thermal joint further comprises a complaint thermal conductive material formed between planar portions of the non-active surface of the semiconductor chip and the planar mating surface of the heat conducting device.

In yet another exemplary embodiment of the invention, a semiconductor package comprises a semiconductor chip having one or more thermal fins bonded on a non-active surface of the semiconductor chip, wherein the one or more thermal fins are bonded on an area of the non-active surface which coincides with a hot spot region of the semiconductor chip, a heat conducting device having a planar mating surface with one or more recessed structures formed therein, and a thermal joint formed between the non-active surface of the semiconductor chip and the planar mating surface of the heat conducting device. The thermal joint comprises the one or more thermal fins insertably engaged with the one or more recessed structures with a compliant thermal conductive material formed between the one or more thermal fins and recessed structures. The thermal joint further comprises a complaint thermal conductive material formed between planar portions of the non-active surface of the semiconductor chip and the planar mating surface of the heat conducting device.

These and other exemplary embodiments, aspects, features, and advantages of the present invention will become apparent from the following detailed description of exemplary embodiments, which is to be read in connection with the accompanying drawings.

BRIEF DESCRIPTION OF THE DRAWINGS

FIGS. 2A-2D are schematic diagrams that illustrate an apparatus for thermally coupling a semiconductor chip to a heat conducting device according to an exemplary embodiment of the invention.

FIGS. 3A-3D are schematic diagrams that illustrate an apparatus for thermally coupling a semiconductor chip to a heat conducting device according to another exemplary embodiment of the invention.

FIGS. 3E-G are schematic diagrams that illustrate an apparatus for thermally coupling a semiconductor chip to a heat conducting device according to another exemplary embodiment of the invention.

FIGS. 5A-5D are schematic diagrams that illustrate an apparatus for thermally coupling a semiconductor chip to a heat conducting device according to another exemplary embodiment of the invention.

FIGS. 6A-6C are schematic top views of single chip modules, which generally illustrate exemplary methods for thermally coupling high power density regions at various locations on a semiconductor chip with the lowest thermal resistance to a heat conducting device, according to exemplary embodiments of the invention.

FIGS. 8A-8D are schematic diagrams that illustrate an apparatus for thermally coupling a semiconductor chip to a heat conducting device according to another exemplary embodiment of the invention.

FIGS. 9A and 9b are schematic diagrams that illustrate an apparatus for thermally coupling a semiconductor chip to a heat conducting device according to another exemplary embodiment of the invention.

DETAILED DESCRIPTION OF EXEMPLARY EMBODIMENTS

Figure 1:
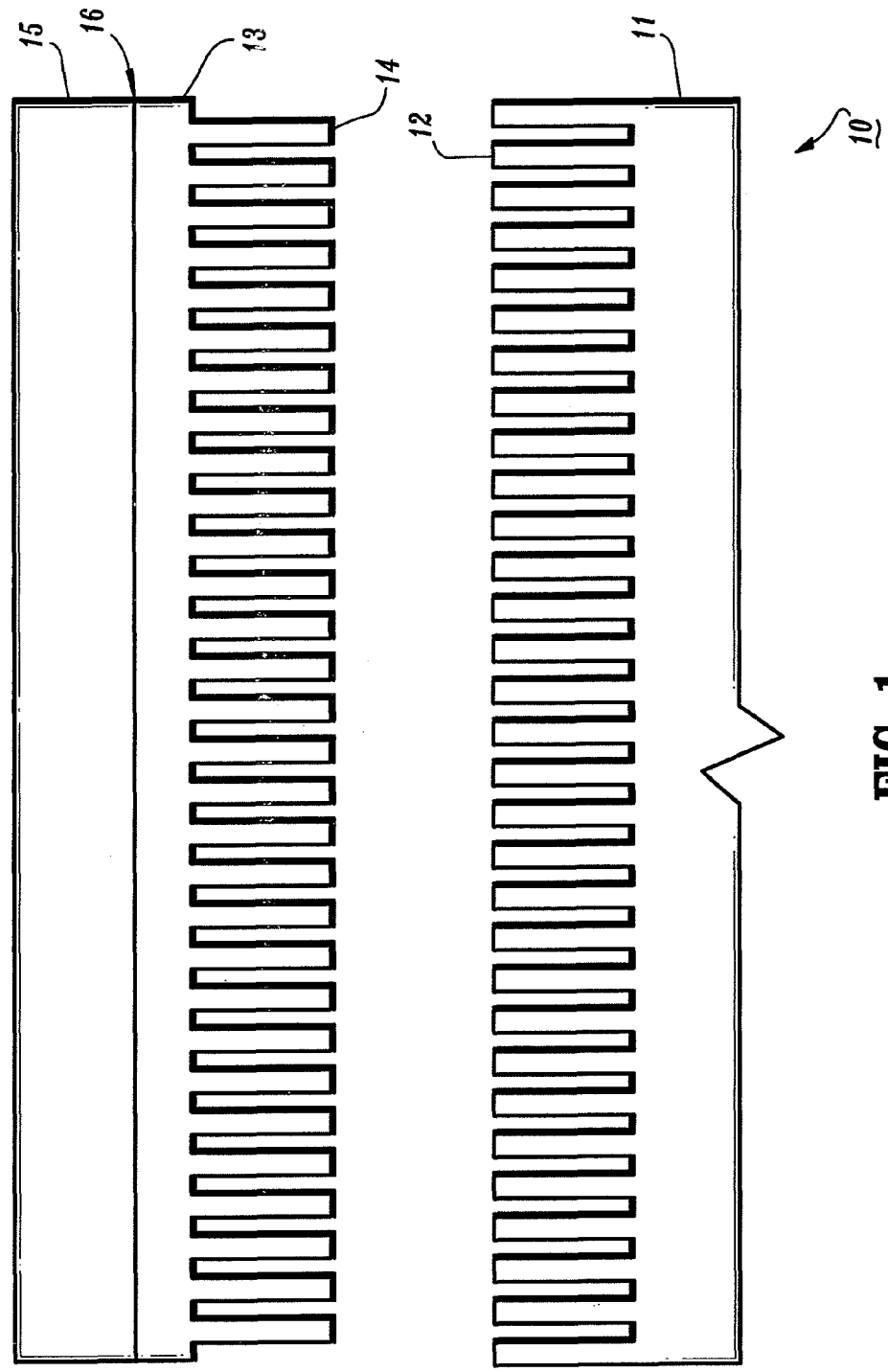
FIG. 1 is a diagram that schematically illustrates a conventional apparatus for thermally coupling a semiconductor chip to a heat sink.

In general, exemplary embodiments of the invention include apparatus and methods for cooling semiconductor integrated circuit (IC) chip packages. More specifically, exemplary embodiments of the invention include apparatus and methods for thermally coupling a semiconductor chip directly to a heat conducting device, which is formed of a material having a high thermal conductivity (e.g., copper heat sink or package lid). Thermal coupling is achieved using a thermal joint that provides increased thermal conductivity (or reduced thermal resistance) of the thermal connection between the semiconductor chip and the heat conducting device, while minimizing or eliminating mechanical stress at the thermal joint caused by the relative displacement between the semiconductor chip and heat conducting device with temperature cycling due to differences in thermal expansion between the chip and heat conducting device over a wide temperature range. Moreover, exemplary embodiments of the invention include apparatus and methods for thermally coupling a semiconductor chip directly to a heat conducting device using a thermal joint that provides reduced thermal resistance at specific areas of the chip where there are greater than average power densities, to thereby avoid "hot spots".

It is to be understood that the term "heat conducting device" as used herein refers broadly to any thermally conductive device that can be thermally coupled to a semiconductor chip to dissipate heat that is generated by the semiconductor chip. For example, a "heat conducting device" may comprise a heat sink, thermal hat, cooling plate, package lid or cap, or any other device that can be thermally coupled to the semiconductor chip to conduct heat away from the semiconductor chip. Moreover, the term "semiconductor chip" as used herein broadly refers to a semiconductor die, wafer or substrate, for example, having heat generating components/circuits formed on or in an active surface thereof, and wherein the substrate may be formed of materials such as silicon, GaAs, or other semiconductor material.

In one exemplary embodiment of the invention, a semiconductor chip (e.g., silicon IC chip) is thermally coupled to a heat conducting device (e.g., copper heat sink) by forming a "microfin thermal joint" (or thermal connector) between mating surfaces of back (or non-active side) of the semiconductor chip and heat conducting device. In general, a "microfin thermal joint" according to an embodiment of the invention comprises a plurality of parallel interdigitated thermal microfins, which are separated by a compliant thermally conductive material applied between the interdigitated thermal microfins. The interdigitated thermal microfins comprise thermal microfins that are formed on the back surface of the semiconductor chip, which engage matching thermal microfins that are formed on a surface of the heat conducting device.

Moreover, in accordance with various exemplary embodiments of the invention as described in detail below, the thickness of the compliant thermally conductive material between the interdigitated thermal microfins can be locally varied across the thermal connection between the semiconductor chip and heat conducting device, so as to optimize heat removal at specific regions of the IC chip where there are greater than average power densities (i.e., greater heat generation), while relieving thermal expansion mismatch stress at the thermal connection over a wide temperature range. For example, for a band of interdigitated thermal microfins that extends across a center region of the semiconductor chip, the spacing between the interdigitated microfins in such band can be minimized to provide a low thermal resistance path from the semiconductor chip to the heat conducting device, to thereby improve cooling in the region across the center of the semiconductor chip. The orientation of such band can be adjusted to align with a "hot spot" on the semiconductor chip. Furthermore, to accommodate for differences in thermal expansion between the semiconductor chip and heat conducting device, the spacing between the interdigitated thermal microfins is variably increased across the thermal connection as the relative displacement due to the thermal expansion mismatch between the semiconductor chip and heat conducting device increases.

Referring now to FIGS. 2A-2D, schematic diagrams illustrate an apparatus for thermally coupling a semiconductor chip to a heat conducting device according to an exemplary embodiment of the invention. More specifically, FIG. 2A illustrates a schematic side-view of a semiconductor package (20) according to an exemplary embodiment of the invention, which comprises a heat conducting device (21) (e.g., a copper heat sink, etc.) that is thermally coupled to the back (non-active) surface of a semiconductor chip (22) via a microfin thermal connection (23) according to one exemplary embodiment of the invention.

The illustrative embodiment of FIG. 2A shows the microfin thermal connection (23) being divided into a plurality of discrete regions (or bands) (R1), (R2) and (R3), which extend across the chip (22). FIGS. 2B, 2C and 2D are schematic side-views that illustrate, in detail, portions of the microfin thermal connection (23) in the exemplary regions (R1), (R2) and (R3), respectively. In general, as depicted in FIGS. 2B-2D, the thermal microfin connection (23) comprises a plurality of parallel interdigitated thermal microfins (21a, 22a) separated by a compliant thermally conductive material (24) (or "TIM" (thermal interface material)). The interdigitated thermal microfins (21a, 22a) comprise thermal microfins (21a) formed on a mating surface of the heat conducting device (21), which are interleaved with matching thermal microfins (22a) formed on the back (non-active) surface of the semiconductor chip (22). In the exemplary embodiment of FIGS. 2A-2D, it is assumed that parallel interdigitated thermal microfins (21a, 22a) of the microfin thermal connection (23) longitudinally extend across the semiconductor chip (22) in a direction perpendicular to the plane of the drawing sheet. The compliant thermally conductive material (24) provides a low thermal resistance thermally conductive path between the thermal microfins (21a) and (22a) of the heat conducting device (21) and semiconductor chip (22), while being variably spaced across the chip (22) to allow for thermal expansion or contraction between the semiconductor chip (22) and heat conducting device (21).

More specifically, as depicted in the exemplary embodiments of FIGS. 2B-2D, the thickness of the TIM (24) between the interdigitated microfins (21a) and (22a) is different in each of the regions R1, R2 and R3 of the thermal microfin connection (23), wherein the thickness of the TIM (24) is the smallest in the region (R1) that extends across the center (C) portion of the semiconductor chip and wherein the thickness of the TIM (24) increases in the regions (R2) and (R3) that extend across the regions of the semiconductor chip, which are away from the center region of the chip (22) where the relative displacement due to the thermal expansion mismatch is greater.

In general, the thickness of the TIM (24) in the different regions (bands) (R1, R2, R3) across the microfin thermal connection (23) is obtained by forming the microfins (21a, 22a) to have a fixed width (W) and varying the pitch (P) of fixed-width microfins in each discrete region, such that the gaps (G) between the interdigitated microfins (which are filled with TIM (24)) in such regions are increased as the distance of the region from the center of the semiconductor chip (22) increases.

More specifically, FIG. 2B is a schematic side-view of a portion of the microfin thermal connection (23) as formed in the region (R1), wherein the interdigitated microfins (21a)

and (22a) have a fixed length (L), as well as a fixed width (W) and pitch (P1) which provides a spacing or gap (G1) between the thermal microfins (21a) and (22a). In the exemplary embodiment of FIG. 2B, it is assumed that the thickness of the TIM (24) between the interdigitated microfins is (G1) across the entire region (R1) at a "zero stress state" (e.g., room temperature).

Moreover, FIG. 2C is a schematic side-view of a portion of the microfin thermal connection (23) as formed in the region (R2), wherein the interdigitated microfins (21a) and (22a) have a fixed length (L), as well as a fixed width (W) and pitch (P2), which provides a spacing or gap (G2) between the microfins (21a) and (22a). In the exemplary embodiment of FIG. 2C, it is assumed that the thickness of the TIM (24) between the interdigitated microfins is (G2) across the entire region (R2) at the "zero stress state". Further, FIG. 2D is a schematic side view of a portion of the microfin thermal connection (23) as formed in the region (R3), wherein the interdigitated microfins (21a) and (22a) have a fixed length (L), as well as a fixed width (W) and pitch (P3), which provides a spacing or gap (G3) between the microfins (21a) and (22a). In the exemplary embodiment of FIG. 2D, it is assumed that the thickness of the TIM (24) between the interdigitated microfins is (G3) across the entire region (R3) at the "zero stress state".

As depicted in FIGS. 2B-2D, in each region (R1, R2, R3) of the microfin thermal connection (23), the width (W) of the microfins is fixed but the pitch between the microfins is varied (P3>P2>P1) such that the thickness of the TIM (24) between the interdigitated microfins (21a, 22a) increases (G3>G2>G1) to accommodate for increased relative displacement at regions of the thermal connection (23) away from the center (C) of the chip (22). In particular, assuming a "neutral stress point" of the package (20) which coincides with the center (C) of the semiconductor chip (22), the relative displacement due to the difference in thermal expansion between the chip (22) and heat conducting device (21) in the direction perpendicular to the thermal microfins (i.e., the directions as indicated by the arrows in FIG. 2A), the thickness of the TIM (24) between the interdigitated microfins in the region (R1) can be minimized to reduce the thermal resistance of the thermal path between the semiconductor chip (22) and heat conducting device (21).

Furthermore, the thickness of the TIM (24) between the interdigitated microfins in the regions (R2) and (R3) away from the center of the chip (22) can be increased, where the relative displacement due to the difference in thermal expansion between the chip (22) and heat conducting device (21) increases in accordance with the distance from the center (C) of the chip (22), to thereby prevent unacceptable mechanical stress at the connection (23) that would otherwise result in such regions if the interdigitated microfins where too closely spaced.

FIGS. 3A-3D are schematic diagrams that illustrate an apparatus for thermally coupling a semiconductor chip to a thermally conductive device according to another exemplary embodiment of the invention. More specifically, FIGS. 3A-3D illustrate a semiconductor package (30) comprising a microfin thermal joint (33) according to another embodiment of the invention, which is formed between a heat conducting device (21) and semiconductor chip (22). The exemplary embodiments of FIGS. 3A-3D are similar to the exemplary embodiments of FIGS. 2A-2D discussed above, except that the variation in thickness (i.e., difference in gaps (G)) of the compliant thermally conductive material between the interdigitated microfins in different regions (R1, R2, R3) across the microfin thermal joint (33) is achieved by fixing the pitch (P) of the thermal microfins, while varying the width (W) of the microfins in the different regions.

More specifically, FIG. 3A illustrates a schematic side-view of an exemplary semiconductor package (30) according to an exemplary embodiment of the invention, which comprises a heat conducting device (21) (e.g., a copper heat sink) that is thermally coupled to the back (non-active) surface of a semiconductor chip (22) via a microfin thermal connection (33). As in FIG. 2A, the microfin thermal connection (33) is divided into a plurality of discrete regions, or bands, (R1), (R2) and (R3), across the chip (22).

FIGS. 3B, 3C and 3D are schematic side-views that illustrate, in detail, portions of the microfin thermal connection (33) in the exemplary regions (R1), (R2) and (R3), respectively. More specifically, FIG. 3B illustrates a portion of the microfin thermal connection (33) as formed in the region (R1), wherein the interdigitated microfins (21a) and (22a) have a fixed length (L), as well as a width (W1) and (P) which provides a spacing or gap (G1) between the thermal microfins (21a) and (22a). In the exemplary embodiment of FIG. 3B, it is assumed that the thickness of the TIM (24) between the interdigitated microfins is (G1) across the entire region (R1) at a "zero stress state" (e.g., room temperature).

Moreover, FIG. 3C illustrates a portion of the microfin thermal connection (33) as formed in the region (R2), wherein the interdigitated microfins (21a) and (22a) have a fixed length (L), as well as a width (W2) and pitch (P) which provides a spacing or gap (G2) between the microfins (21a) and (22a). In the exemplary embodiment of FIG. 3C, it is assumed that the thickness of the TIM (24) between the interdigitated microfins is (G2) across the entire region (R2) at the "zero stress state". Further, FIG. 3D illustrates a portion of the microfin thermal connection (33) as formed in the region (R3), wherein the interdigitated microfins (21a) and (22a) have a fixed length (L), as well as a width (W3) and pitch (P) which provides a spacing or gap (G3) between the microfins (21a) and (22a). In the exemplary embodiment of FIG. 3D, it is assumed that the thickness of the TIM (24) between the interdigitated microfins is (G3) across the entire region (R3) at the "zero stress state".

As depicted in FIGS. 3B-3D, in each region (R1, R2, R3) of the microfin thermal connection (33), the pitch (P) of the thermal microfins is fixed and the width (W) of the microfins are varied (W1>W2>W3) such that the thickness of the TIM (24) between the interdigitated microfins (21a, 22a) increases (G3>G2>G1) to accommodate for the relative displacement at regions of the thermal connection (33) away from the center (C) of the chip (22). In particular, assuming a "neutral stress point" of the package (30) coincides with the center (C) of the semiconductor chip (22), the difference in thermal expansion between the chip (22) and heat conducting device (21) in the direction perpendicular to the thermal microfins (i.e., the directions as indicated by the arrows in FIG. 3A), the thickness of the TIM (24) between the interdigitated microfins in the region (R1) can be minimized to reduce the thermal resistance of the thermal path between the semiconductor chip (22) and heat conducting device (21).

Furthermore, the thickness of the TIM (24) between the interdigitated microfins in the regions (R2) and (R3) away from the center of the chip (22), where the relative displacement due to the difference in thermal expansion between the chip (22) and heat conducting device (21), increases in accordance with the distance from the center (C) of the chip (22), to thereby prevent unacceptable mechanical stress at the connection (23) that would otherwise result in such regions if the interdigitated microfins where too closely spaced.

It is to be appreciated that in accordance with the invention, a microfin thermal connector comprising a series of parallel interdigitated microfins separated by a thin layer of compliant thermally conductive material (such as depicted in the exemplary embodiments of FIGS. 2A-2D and 3A-D) provides a thermally efficient means for directly coupling a semiconductor chip (such as a silicon chip) to a heat conducting device (such as a copper heat sink) having a high thermal conductivity and a significantly different thermal expansion from that of the chip material.

Indeed, the interdigitated microfins provide an increased surface area for heat transfer and a thin complaint material provides a low resistance thermal path between the interdigitated microfins. Accordingly, a microfin thermal connection can provide a reduced thermal resistance between, e.g., the back surface of a Si chip and a copper heat sink, as compared to conventional methods. In the exemplary embodiments described above with reference to FIGS. 2 and 3, for example, the thermal resistance of the heat transfer path across the microfin thermal joint will vary over the width of the chip (22), wherein the thermal resistance is lowest in the center portion and greatest along the outside edge portions.

More specifically, the thermal resistance of the heat transfer path is a function of (i) the contact area (which is increased for high aspect ratio fine pitched fins), (ii) the fin efficiency (which is reduced for high aspect ratio fins); and (iii) and inversely with the thickness of the layer of thermally compliant material. With proper design, the thermal resistance can be reduced by ~3× for an equivalent layer thickness of thermally compliant material by using a microfin thermal joint according to the invention, as compared to a thermal connection using a compliant material between parallel flat surfaces.

Furthermore, the compliant thermally conductive material between the interdigitated microfins readily provides relief of thermal expansion mismatch stress along the direction in which the thermal microfins extend across the thermal connection. Moreover, relief of thermal expansion mismatch stress in a direction perpendicular to the direction in which the thermal microfins extend across the thermal connection, is achieved by varying the thickness of the compliant thermally conductive material between the interdigitated fins, with the thickness being increased toward the two opposite outside edges of the chip where the relative displacement due to thermal expansion mismatch is greatest.

For example, as depicted in the exemplary embodiments of FIGS. 2 and 3, varying thickness of the compliant material in discrete regions across the microfin thermal joint can be achieved by varying the pitch between fixed-width microfins in different regions or by varying the width of the microfins in different regions while maintaining a fixed pitch. In other exemplary embodiments of the invention, a microfin thermal connector may be formed to have a continuous variation of the microfin pitch and/or the microfin width across the chip, as opposed to having multiple discrete bands in the exemplary embodiments of FIGS. 2 and 3.

Relieving the stress in the direction perpendicular to the fins requires either compression or flow of the compliant thermally conductive material between the fins. In other exemplary embodiments of the invention, the microfin thermal joints depicted in FIGS. 2 and 3 can be modified to enable the compliant material to flow more easily from one side of a microfin to the other side providing even more stress relief. For instance, the microfins need not be continuous but can have breaks/gaps along their length. The density of these gaps or breaks can be adjusted to correspond to the amount of flow expected. For example, relatively more gaps/breaks can be provided in the thermal microfins that are near the edges of the chip as compared to the center, since the relative displacement due to the difference in thermal expansion is larger near the edges. This can be illustrated with reference to the schematic diagrams of FIGS. 3E, 3F and 3G, which illustrate an apparatus for thermally coupling a semiconductor chip to a heat conducting device according to another exemplary embodiment of the invention. In particular, FIGS. 3E, 3F and 3G are schematic top plan views taken along slices through the middle of the different regions R1, R2 and R3 of the thermal joint (23) illustrated in FIGS. 3B, 3C and 3D, respectively. As shown in FIGS. 3E~3G, the parallel interdigitated thermal microfins (21a, 22a) in the respective regions (R1, R2 and R3) of the thermal joint (23) are formed having respective gaps/breaks (g1, g2, and g3) along the lengths thereof. The density of the gaps (g1, g2 and g3) formed along the thermal microfins (21a, 22a) in respective regions (R1, R2 and R3) is shown to increase from the center region of the semiconductor chip toward the edge regions of the semiconductor chip.

It is to be understood that with a microfin thermal connector having structures such as depicted in the exemplary diagrams of FIGS. 2 and 3, the selection of the parameters, e.g., length, pitch, width of the microfins, thickness of the TIM, etc., will vary depending on various factors. Such factors include, but are not limited to, the materials that form the semiconductor chip, heat conducting device and the TIM, the dissimilarity of coefficients of thermal expansion, the characteristics of the TIM (e.g., viscosity, thermal resistance, etc.), the size of the IC chip, the uniformity/non-uniformity of power distribution on the chip, the temperature range of operation/exposure of the package, and a multitude of other factors as would be readily apparent to one of ordinary skill in the art.

In general, in one exemplary embodiment of the invention, the length (L) of the microfins are less than or equal to about 500 microns, and preferably less than or equal to about 300 microns. Moreover, the width (W) of the microfins are less than or equal to about 250 microns, and preferably less than or equal to about 100 microns. Moreover, in one exemplary embodiment of the invention, as explained in further detail below, the thickness of the TIM between the microfins is selected based on the maximum expected relative displacement due to the difference in thermal expansion between the chip and heat conducting device. However, in one exemplary embodiment of the invention, for a TIM that is a thermal paste, a minimum thickness is about 25 microns. Further, for a TIM that is a thermally conductive fluid, a minimum thickness is about 5 microns. The pitch (P) of the microfins can be determined in accordance with the above dimensions.

For purposes of illustration, specific exemplary embodiments for thermally coupling a semiconductor chip to a heat conducting device using microfin thermal connectors as depicted in FIGS. 2 and 3, will now be discussed, wherein it is assumed that the semiconductor chip (22) is made of Si and the heat conducting device (21) is made of Cu, wherein Cu has thermal coefficient of expansion (TCE) of about 16.5 ppm/° C. and Si has a TCE of about 2.5 ppm/° C. It is further assumed that the exemplary structures of FIGS. 2 and 3 will be subjected to thermal expansion for temperatures in the range of −60° to 100° C.

Furthermore, as depicted in FIGS. 2A and 3A, it is assumed that the microfin thermal connection is 20 mm wide (i.e., the width of the chip (22) in the direction perpendicular to the thermal microfins), wherein the outer most regions (R3) of the microfin thermal connection are 3 mm wide bands that extend along two opposite edges of the chip (22), wherein a center region (R1) of the microfin thermal connection is an 8 mm wide band that extends along the center (C) of the chip

(22) at 4 mm on each side of the center (C), and wherein middle regions (R2) of the microfin thermal connection are 3 mm wide bands that extend along the chip (22) between the center region (R1) and edge regions (R3).

The relative displacement, $TE_{Diff}$, due to the difference in thermal expansion between the Si chip (22) and the Cu heat conducting device (21), varies as follows:

$$TE_{Diff} = TCE_{Diff} \cdot T_{Diff} \cdot D_{NeutralState} \quad (1)$$

wherein $TCE_{Diff}$ denotes the difference in the TCEs of Cu and Si (16.5 ppm/° C.–2.5 ppm/° C.), wherein $T_{Diff}$ denotes the difference in temperature from a "zero stress state" (which would have a maximum value of 80° C., assuming the zero stress state is at 20° C. (room temperature) and the storage range is from −60° C. to 100° C.), and wherein $D_{NeutralState}$ denotes the distance from a "neutral stress point", which is assumed to be the center of the chip (22).

In accordance with equation (1) above, the relative displacement due to the difference in thermal expansion between the Si chip (22) and the Cu heat conducting device (21) is smallest in the center area of the Si chip (22) and largest along the outside edges of the Si chip (22). More specifically, by way of example, in the direction along the Si chip (22) which is perpendicular to direction in which the microfins extend, and assuming a temperature of 100° C., the relative displacement due to the difference in thermal expansion, $TE_{Diff}$, between the Si chip (22) and the Cu heat conducting device (21) would be about 4.5 microns at a distance of 4 mm from the center (neutral stress point) of the Si chip (22), the relative displacement due to the difference in thermal expansion would be about 7.8 microns at a distance of 7 mm from the center of the Si chip (22), and the relative displacement due to the difference in thermal expansion would be about 11 microns at a distance of 10 mm from the center of the Si chip (22) (i.e., at the left and right edges of the 20 mm wide chip (22) depicted in FIG. 2, for example).

Figures 4A, 4B, 4C:
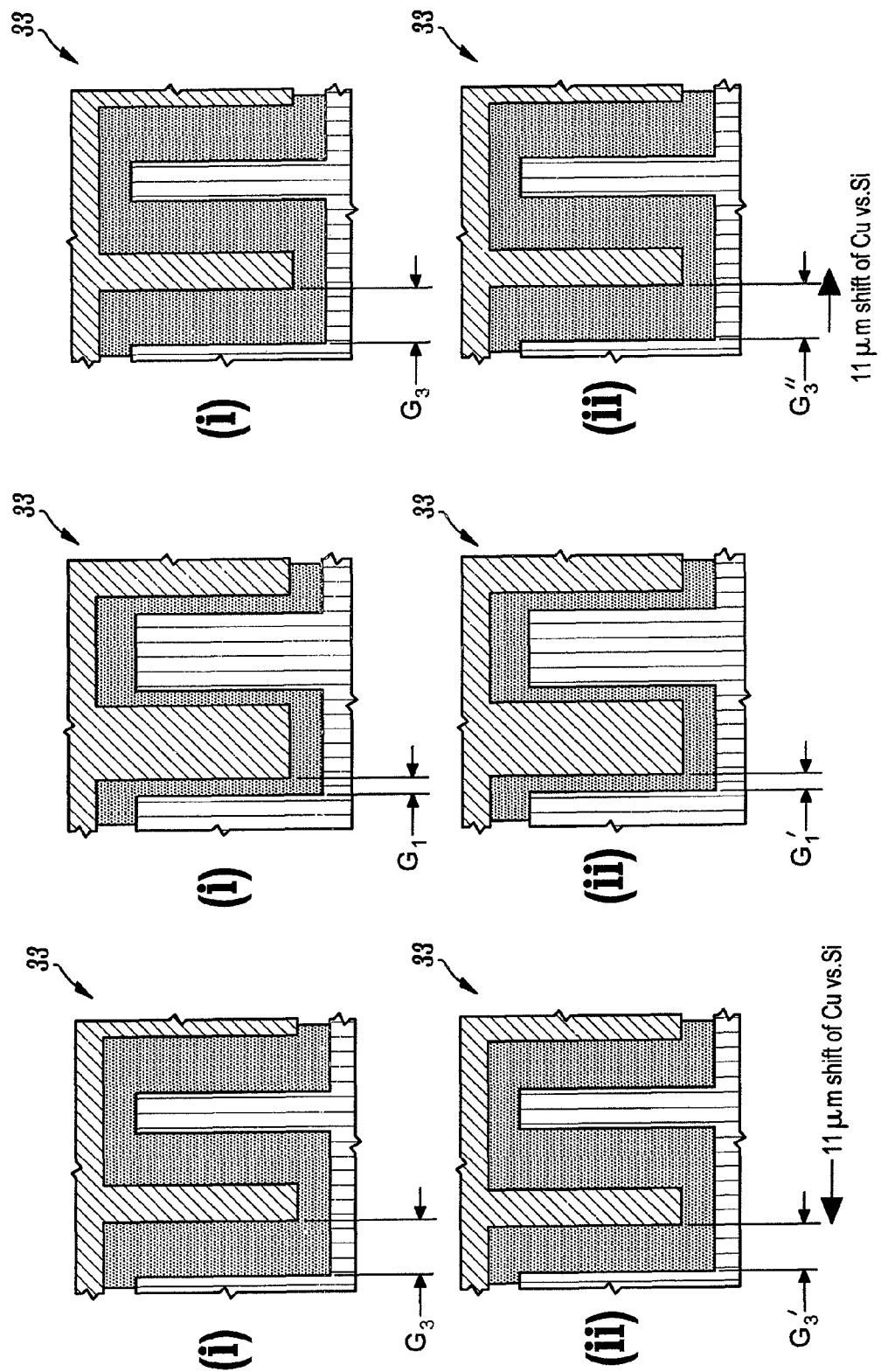
FIGS. 4A-4C are exemplary schematic diagrams that illustrate the displacement of the heat conducting device relative to the semiconductor chip of the exemplary apparatus of FIGS. 3A-3D, which is due to differences in thermal expansion of the thermally conductive device made of copper and the semiconductor chip made of silicon.

For the example described above, FIGS. 4A-4C are schematic diagrams that illustrate the thermal expansion of the copper heat conducting device (21) relative to the Si chip (22), which are thermally coupled via the microfin thermal connection (33) as depicted in the exemplary embodiment of FIGS. 3A-3D. In particular, FIG. 4B depicts schematic side views of a center point of the microfin thermal connection (33) at (i) room temperature (zero stress state) and at (ii) 100 deg. C. FIG. 4B illustrates that there is no relative displacement due to the difference in thermal expansion of the copper heat conducting device (21) relative to the Si chip (22) (G1=G1') at the center of the chip (22).

Further, FIG. 4A depicts schematic side views of the left edge of the microfin thermal connection (33) at (i) room temperature (zero stress state) and at (ii) 100 deg. C. (i.e., at about 10 mm from the center (C)). FIG. 4A illustrates that there is a relative displacement due to the difference of thermal expansion of the copper heat conducting device (21) relative to the Si chip (22) of about 11 um (i.e., the gap size G3' is 11 um smaller than G3).

Likewise, FIG. 4C depicts schematic side views of the right edge of the microfin thermal connection (33) at (i) room temperature (zero stress state) and at (ii) 100 deg. C. (i.e., at about 10 mm from the center (C)). FIG. 4C illustrates that there is a relative displacement due to the difference of thermal expansion of the copper heat conducting device (21) relative to the Si chip (22) of about 11 um (i.e., the gap size G3" is about 11 um greater than G3).

In one exemplary embodiment of the invention, it is preferable that the maximum relative displacement due to the difference in thermal expansion between the chip (e.g., a Si chip) and the heat conducting device (e.g., a Cu heat sink) is a small fraction of the thickness of the compliant thermally conductive material in the gaps (G) between the interdigitated microfins. For example, for semiconductor packages having microfin thermal connections as depicted in exemplary embodiments of FIGS. 2 and 3, the nominal thickness of the compliant thermally conductive material (TIM (24)) between the microfins is selected to be about eight times greater than the expected maximum relative displacement due to the difference in thermal expansion. With low viscosity liquids, a closer spacing between the microfins could be used.

For example, in one exemplary embodiment of the invention, for a microfin thermal connection that thermally couples a Si chip and copper heat conducting device (such as depicted in FIG. 2), the width and length of the microfins can be fixed at W=75 microns and L=300 microns, respectively. Further, the pitch in the regions (R1, R2, R3) is P1=216 microns, P2=282 microns, and P3=350 microns, respectively, resulting in gap sizes (at room temperature) of G1=33 microns, G2=66 microns and G3=100 microns. Furthermore, in another exemplary embodiment of the invention, for a microfin thermal connection that thermally couples a Si chip and copper heat conducting device, such as depicted in FIG. 3, the pitch and length of the microfins in each of the regions (R1, R2 and R3) are fixed at P=350 microns and L=300 microns, respectively. Further, the width of the microfins in each of the regions (R1, R2, R3) is W1=75 microns, W2=109 microns, and W3=142 microns, respectively, resulting in gap sizes (at room temperature) of G1=33 microns, G2=66 microns and G3=100 microns.

FIGS. 5A-5D are schematic diagrams that illustrate an apparatus for thermally coupling a semiconductor chip to a heat conducting device according to another exemplary embodiment of the invention. More specifically, FIG. 5A is a schematic side-view of a semiconductor package (50) comprising a microfin thermal connection (53) which thermally couples a heat conducting device (21) and a semiconductor chip (22). Similar to the exemplary embodiment of FIG. 2A, the illustrative embodiment of FIG. 5A shows the microfin thermal connection (53) being divided into a plurality of discrete regions (R1), (R2) and (R3).

FIGS. 5B, 5C and 5D are schematic side views of a portion of the microfin thermal connection (53) as formed in the regions (R1), (R2) and (R3), respectively. The exemplary microfin thermal connection (53) is similar to the exemplary microfin thermal connection (23) (as depicted in FIGS. 2B-2D) to the extent that the different gap sizes (G1) (G2) and (G3) (i.e., thickness of the TIM between the microfins) are obtained by maintaining a fixed width W and varying the pitch, P, of the microfins. However, as depicted in FIGS. 5B-5D, the microfin thermal connection (53) comprises air gaps (54) along the heat sink (21) above the microfins (22a) of the chip (22), and a discontinuous layer of TIM (55).

The air spaces (54) allow the package structure (50) to have vertical mechanical compliance. In particular, the air gaps (54) provide vertical compliance by reducing the resistance to vertical motion and allowing the compliant thermally conductive material (55) to flow and be displaced vertically due to differential thermal expansion or contraction of the packaging structure. In one exemplary embodiment of the invention, the TIM (55) comprises a low viscosity liquid, which is used to prevent the formation of voids between the microfins. Indeed, by using a low viscosity liquid for the TIM (55), the surface tension of such material would draw the fluid back into the narrow gaps between the microfins.

It is to be appreciated that when an semiconductor chip is centered on the "neutral stress point" of a semiconductor package, such as in a SCM (single chip module) or the center chip of an MCM (multi-chip module), the orientation of microfins of a microfin thermal connector according to the invention can be selected so that the "hot spot" region on the semiconductor chip (the region with the highest power density region) is thermally coupled with the lowest thermal resistance to a heat conductive device (heat sink).

For example, FIGS. 6A, 6B and 6C are exemplary schematic diagrams of SCMs, which illustrate methods for orientating microfins for various locations of a "hot spot" of an IC chip. In particular, the exemplary diagrams of FIGS. 6A-6C illustrate package substrates (60a, 60b, 60c) having respective semiconductor chips (61a, 61b, 61c) mounted face down thereon, wherein it is assumed that the chips (61a, 61b, 61c) are centered on the neutral stress point of the respective packages (i.e., the package center). Each chip (61a, 61b, 61c) is depicted as having a "hot spot" region (62a, 62b, 62c), respectively, and a band of microfins (63a, 63b, 63c), respectively, which are formed on the back surface of the chip (61a, 61b, 61c). A heat sink or thermal cap (not shown) with matching microfins would be thermally coupled to the back surface of each chip (61a, 61b, 61c). In the exemplary diagrams of FIGS. 6A-6C, for illustrative purposes, it is to be understood that only the band of microfins (63a, 63b, 63c) having the smallest gap between the microfin fins is shown. In other words, FIGS. 6A-6C, only illustrate the region of the microfin thermal connector having the lowest thermal resistance (thinnest TIM layer between interdigitated microfins).

FIG. 6A illustrates a "hot spot" region (62a) at a top center region of the chip (61a), wherein the band of microfins (63a) is orientated such that the microfins extend in a direction that passes through the "hot spot" (62a) and the center of the package. Further, FIG. 6B illustrates the "hot spot" region (62b) at a side center region of the chip (61b), wherein the band of microfins (63b) is orientated such that the microfins extend in a direction that passes through the "hot spot" (62b) and the center of the package. Moreover, FIG. 6C illustrates the "hot spot" region (62c) on a corner of the chip (61c), wherein the band of microfins (63c) is orientated such that the microfins extend in a direction that passes through the "hot spot" (62c) and center of the package. It is to be noted that the band of microfins need not pass through the center of the chip, but this will result in increased thermal resistance along the edge or corner of the chip which is further from the center of the band of microfins.

Figure 7:
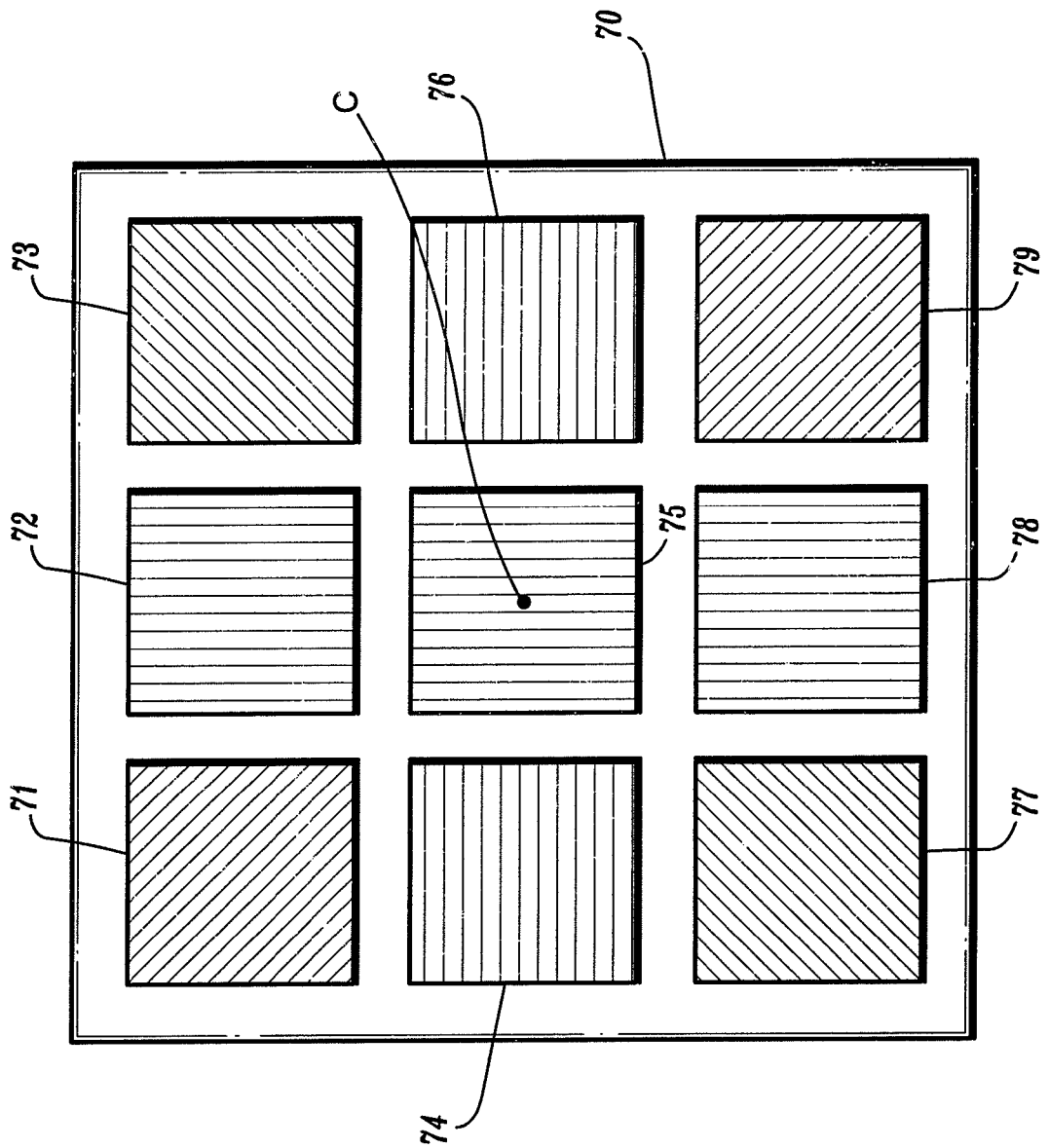
FIG. 7 is a schematic top view of multi-chip module comprising a plurality of semiconductor chips, which generally illustrates a method for minimizing thermal expansion mismatch stress between the plurality of chips and a heat conducting device that is commonly thermally coupled to the semiconductor chips.

FIG. 7. is an exemplary schematic diagram of an MCM (multi-chip module) package comprising a package substrate (70) having a plurality of IC chips (71~79) mounted thereon, wherein each chip (71~79) comprises one or more bands of microfins formed on the back surfaces thereof. In one exemplary embodiment of the invention, wherein a common heat conducting device (e.g., heat sink or cold plate) is thermally coupled to the chips (71~79), the thermal microfins are orientated such that the microfins are directed toward the neutral stress point of the package (i.e., the package center). More specifically, as depicted in FIG. 7, the bands of microfins that are formed on the back surfaces of chips (71, 72, 73, 74, 76, 77, 78, 79) are arranged to have a radial pattern directed to the package center (C). The center chip (75) is assumed to be centered on the package center, and the microfins of the center chip (75) can be oriented in any desired direction as in FIG. 6A-6C. The exemplary radial pattern of microfins depicted in FIG. 7 would minimize the relative motion of the microfins on the chips to and away from matching microfins on a common heat sink.

FIGS. 8A-8D are schematic diagrams that illustrate an apparatus for thermally coupling a semiconductor chip to a heat conducting device according to another exemplary embodiment of the invention. More specifically, FIG. 8A is a schematic side view of a semiconductor package (80) comprising a thermal connector (83) which thermally couples a heat conducting device (21) to a semiconductor chip (22). FIG. 8A illustrates the thermal connector (83) being divided into a plurality of discrete regions (R1) and (R2), with a transition region (T) between the regions (R1) and (R2). In this exemplary embodiment, a portion of the thermal connector (83) comprises a microfin thermal joint structure, wherein the microfins are aligned with a region of the highest power density on the chip (22), and the remaining portions of the thermal connector (83) comprises a compliant thermally conductive layer between two parallel surfaces of the heat conducting device (21) and chip (22).

More specifically, FIG. 8B is a schematic side view of a portion of the thermal connector (83) as formed in the exemplary region (R1), wherein the thermal connector (83) comprises a thermal microfin joint having a plurality of interdigitated microfins (21a) and (22a) with a TIM (83) applied therebetween. FIG. 8D is a schematic side view of a portion of the thermal connector (83) as formed in the exemplary region (R2), wherein a layer of TIM (84) is applied between the parallel surfaces of the chip (22) and heat conducting device (21). FIG. 8C is a schematic side view of a portion of the thermal connector (83) at a point of transition (T) between regions (R1) and (R2). In the exemplary embodiment of FIG. 8, the TIMs (83) and (84) may or may not be the same material. In the illustrative embodiment of FIGS. 8A-D, relative to the regions R2, the microfins (21a) project above the flat surface of the heat conducting device (21) and relative to the regions R2, the tops of the microfins (22a) on the chip (22) are flush with the flat surface of the chip (22). Alternate configurations are possible where the tops of the microfins (21a) on the heat conducting device (21) are flush with the flat surface of the heat conducting device (21) in the regions R2 and the microfins (22a) on the chip (22) project above the flat surface of the chip (22) in regions R2 or the flat surfaces in region R2 are located intermediately between the tops and bottoms of the microfins (21a, 22a) formed on the heat conducting device (21) and the chip (22).

In other exemplary embodiments of the invention, a rigid bond (as opposed to a TIM) can be applied between interdigitated microfins of a small portion of a microfin thermal joint, wherein a complaint thermally conductive material is used in the remaining regions of the thermal connector. This would be most useful, for example, for attaching a package lid of an SCM to a chip, wherein the package lid is a highly thermally conductive material such as copper. More specifically, by way of example with reference to the exemplary embodiment of FIG. 8, the semiconductor package (80) may comprise an SCM package, wherein the heat conducting device (21) is a copper package lid thermally coupled to a Si chip (22). In this exemplary embodiment, a rigid bonding material can be applied in a portion of a thermal microfin joint in the region (R1) where the relative displacement, or stress, due to the difference in thermal expansion between the IC chip (22) and a copper package lid (21) would be minimal. Further, the microfins formed in region (R1) could be aligned with a "hot spot" region of the chip (22) using the exemplary methods described above with reference to FIGS. 6A-6C.

Furthermore, in another exemplary embodiment of the invention such as depicted in FIGS. 9A and 9B, a thermal connector can formed using a rigid bond for joining a small region of a chip directly to a heat sink, where such region is aligned with the highest power density region on the chip, and using a compliant thermally conductive material in the remaining areas between the chip and the heat sink.

More specifically, FIG. 9A schematically depicts an IC chip (90) comprising a raised portion (91) or mesa, which is formed on the back surface of the chip (90) and aligned with a "hot spot" region (92) of the chip (90). The chip (90) comprises a plurality of micro solder balls (93) (e.g., C4's) formed on bond pads on the active surface of the chip (90). Furthermore, FIG. 9B schematically illustrates a cross-sectional side view of a semiconductor package structure (99) according to another exemplary embodiment of the invention. The semiconductor package structure (99) comprises the IC chip (90) with the mesa (91) (such as depicted in FIG. 9A) thermally coupled to a heat sink/package lid (95). A thermally conductive bonding material (96) (such as a filled epoxy, a filled polymer adhesive, a filled thermoplastic or solder) is used for rigidly bonding the heat sink (95) to the mesa region (91) of the chip (90), and a layer of compliant thermal conductive material (94) is applied between the remaining region between the chip (90) and heat sink/package lid (95) for providing a thermal interface. The exemplary package structure depicted in FIG. 9B can be used for rigidly bonding an Si chip to a Cu SCM lid.

The exemplary thermal connection depicted in FIG. 9B can be implemented where it is desirable for the rigid adhesive (96) to be less thick than the layer of compliant thermal conductive material (94), so the raised portion (91) can be formed on the chip aligned with the area (92) of highest power density, such as described in U.S. patent application Ser. No. 10/732,015, filed on Dec. 8, 2003, entitled, "Local Reduction of Compliant Thermal Conductive Material Layer Thickness on Chips", which is commonly assigned and fully incorporated herein by reference. This application describes integrated circuit packaging structures, such as in MCMs or SCMs, where a compliant thermally conductive material is applied between a heat-generating integrated circuit chip and a heat sink or cooling plate. Raised regions are formed on the back side of the chip which are aligned to areas of a higher than average power density on the front active surface of the chip such that a thinner layer of the compliant thermally conductive material is formed between the chip and the heat sink or cooling plate after assembly, resulting in a reduced "hot-spot" temperature on the chip.

As noted above, in one exemplary embodiment of a semiconductor package having a structure as depicted in FIG. 9B, instead of using a compliant thermal conductive material between the mesa (91) and heat sink/package lid (95), it may be desirable to use a rigid bond (96) for the purpose of attaching a package lid of an SCM to the chip (90), for example. Furthermore, a rigid bond typically has a lower thermal resistance than a compliant layer. The mesa region (91) is not needed in a given application where it is desirable for the layer of rigid adhesive (96), which bonds the "hot spot' directly to the heat sink", to have the same thickness of the layer of compliant thermal conductive material (94).

Figure 10:
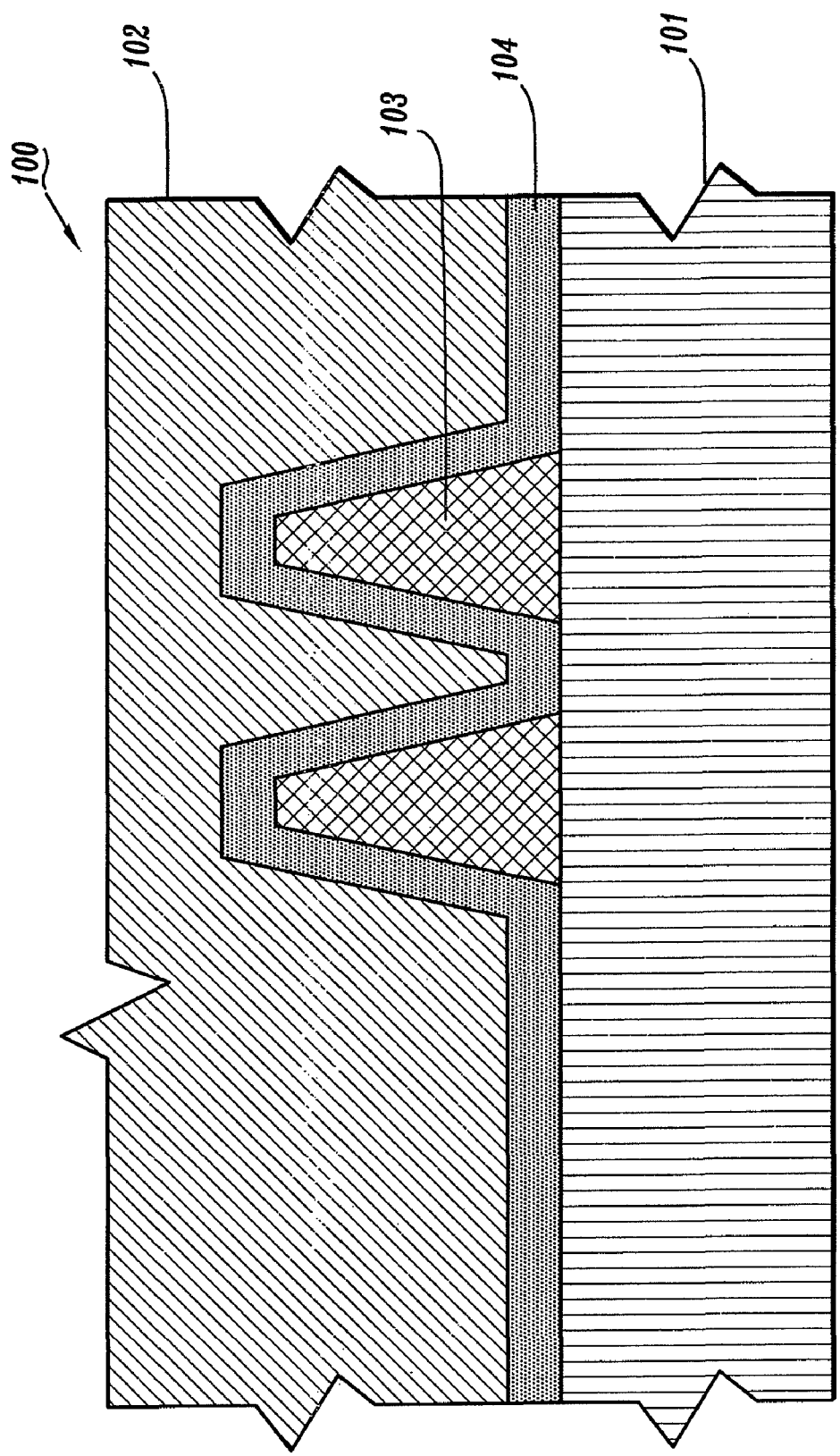
FIG. 10 is a schematic diagram that illustrates an apparatus for thermally coupling a semiconductor chip to a heat conducting device according to another exemplary embodiment of the invention.

FIG. 10 is a schematic cross-sectional view of a semiconductor package structure (100) according to another exemplary embodiment of the invention. The semiconductor package structure (100) comprises an IC chip (101) that is directly thermally coupled to a heat conducting device (102) (e.g., copper package lid) with a thermal connector comprising a plurality of fins (103) that are bonded to the back surface of the chip (101) aligned to a "hot spot" region of the chip. As further depicted in FIG. 10, the fins (103) are inserted into corresponding mating grooves that are formed in the heat sink (102), and a layer of compliant thermal conductive material (104) is formed between the flat surfaces of the chip (101) and heat conducting device (102) and between the fins (103) and the heat conducting device (102). The fins (103) may comprise a highly thermally conductive material such as Sn or Cu that are bonded/soldered to the chip (101). The use of the highly thermally conductive fins (103) in conjunction with the mating structures of the heat conducting device (102) provides a local reduction in the thermal resistance in the heat transfer path between the "hot spot" region of the chip (101) and the heat conducting device (102).

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A semiconductor package, comprising:
a semiconductor chip having a plurality of first thermal fins on a portion of a non-active surface of the semiconductor chip, wherein the first thermal fins longitudinally extend across the portion of the non-active surface of the semiconductor chip;
a heat conducting device having a plurality of second thermal fins on a portion of a mating surface of the heat conducting device, wherein the second thermal fins longitudinally extend across the portion of the mating surface of the heat conducting device; and
a thermal joint formed between the non-active surface of the semiconductor chip and the mating surface of the heat conducting device, wherein the thermal joint comprises a band of interdigitated thermal fins comprising the first and second thermal fins mated together and thermally coupled using an intervening rigid bonding material or a compliant thermally conductive material having a thickness entirely separating the semiconductor chip from the heat conducting device, wherein the rigid bonding material comprises a thermally conductive solder or a filled polymer such as silver filled epoxy, and wherein the thermal joint further comprises a complaint thermal conductive material formed between planar portions of the non-active surface of the semiconductor chip and the mating surface of the heat conducting device whereby the rigid bonding material or compliant thermally conductive material mechanically contacts the heat conducting device and the non-active surface of the semiconductor chip.

2. The semiconductor package of claim 1, wherein the heat conducting device is a package lid, a package cap, a heat sink, a cooling plate, or a thermal hat.

3. The semiconductor package of claim 2, wherein the heat conducting device is formed of copper.

4. The semiconductor package of claim 1, wherein the compliant thermally conductive material between the interdigitated thermal fins and between the planar portions of the non-active surface and mating surface are formed of the same material.

5. The semiconductor package of claim 1, wherein the compliant thermally conductive material between the interdigitated thermal fins and between the planar portions of the non-active surface and mating surface are formed of a different material.

6. The semiconductor package of claim 1, wherein the band of interdigitated thermal fins is orientated to extend in a direction that passes through a hot spot area of the semiconductor chip.

7. The semiconductor package of claim 1, wherein the first and second thermal fins are separated by a gap substantially equal on both sides of a given thermal fin.

8. The semiconductor package of claim 1, wherein thermal fins of the semiconductor chip are arranged to radiate towards a center of the semiconductor package.

9. A semiconductor package, comprising:
   a semiconductor chip having one or more thermal fins bonded on a non-active surface of the semiconductor chip, wherein the one or more thermal fins are bonded on an area of the non-active surface which coincides with a hot spot region of the semiconductor chip, a heat conducting device having a planar mating surface with one or more recessed structures formed therein; and
   a thermal joint formed between the non-active surface of the semiconductor chip and the planar mating surface of the heat conducting device, wherein the thermal joint comprises the one or more thermal fins insertably engaged with the one or more recessed structures with an intervening compliant thermal conductive material formed between the one or more thermal fins and recessed structures having a thickness entirely separating the semiconductor chip from the heat conducting device, and wherein the thermal joint comprises a complaint thermal conductive material formed between planar portions of the non-active surface of the semiconductor chip and the planar mating surface of the heat conducting device whereby the thermal conductive material mechanically contacts the heat conducting device and the non-active surface of the semiconductor chip.

10. The semiconductor package of claim 9, wherein the heat conducting device is a package lid, a package cap, a heat sink, a cooling plate, or a thermal hat.

11. The semiconductor package of claim 9, wherein the heat conducting device is formed of copper.

12. The semiconductor package of claim 9, wherein the thermal fins are formed of copper.

13. The semiconductor package of claim 9, wherein the thermal fins and the recessed structures are separated by a gap substantially equal on both sides of a given thermal fin.

14. The semiconductor package of claim 9, wherein thermal fins of the semiconductor chip are arranged to radiate towards a center of the semiconductor package.

* * * * *